United States Patent
Lamke et al.

(10) Patent No.: US 6,793,371 B2
(45) Date of Patent: Sep. 21, 2004

(54) LED LAMP ASSEMBLY

(75) Inventors: Isadore I. Lamke, Washington, MO (US); Robert D. Plummer, St. Clair, MO (US); Michael E. Dinan, Beaufort, MO (US); Eugene P. Reinhold, Kirkwood, MO (US); John Figura, Defiance, MO (US); Matt Narzinski, St. Louis, MO (US)

(73) Assignee: Mongo Light Co. Inc., Washington, MO (US)

( * ) Notice: Subject to any disclaimer, the term of this patent is extended or adjusted under 35 U.S.C. 154(b) by 0 days.

(21) Appl. No.: 10/003,845

(22) Filed: Nov. 1, 2001

(65) Prior Publication Data

US 2002/0089849 A1 Jul. 11, 2002

Related U.S. Application Data

(63) Continuation-in-part of application No. 09/521,808, filed on Mar. 9, 2000.

(51) Int. Cl.[7] ................................... H01J 7/44
(52) U.S. Cl. ..................... 362/241; 362/800; 362/235; 362/249; 362/247; 362/241
(58) Field of Search ................. 362/235, 800, 362/249, 240, 241, 247

(56) References Cited

U.S. PATENT DOCUMENTS

| | | | | |
|---|---|---|---|---|
| 5,632,551 A | * | 5/1997 | Roney et al. | 362/249 |
| 5,806,965 A | * | 9/1998 | Deese | 362/249 |
| 5,821,695 A | * | 10/1998 | Vilanilam et al. | 315/58 |
| 6,193,392 B1 | * | 2/2001 | Lodhie | 362/235 |
| 6,283,613 B1 | * | 9/2001 | Schaffer | 362/245 |

* cited by examiner

*Primary Examiner*—Anabel M Ton
(74) *Attorney, Agent, or Firm*—Polster, Lieder, Woodruff & Lucchesi, LC

(57) ABSTRACT

A lamp finding particular application in boat trailers and other vehicular applications is provided with a generally unbreakable lamp structure. The lamp preferably is provided with a plurality of LEDs arranged with rows and columns on a circuit card or board. The lamp is constructed by encapsulating the board and LED arrangement in a moldable lens material, which after removal from a suitable mold at least partially defines the lamp body.

19 Claims, 3 Drawing Sheets

LED LAMP ASSEMBLY

CROSS REFERENCE TO RELATED APPLICATIONS

This application is a continuation-in-part of U.S. patent application Ser. No. 09/521,808 filed Mar. 9, 2000, the contents of which are expressly incorporated herein by reference.

BACKGROUND OF THE INVENTION

This invention relates generally to lamps, and more specifically to vehicle lamps having an array of light emitting-diodes (LEDs) providing the light, and a structure and method of construction which produces a light structure that is relatively unbreakable and water resistant and/or water proof. While the invention is described in particular with its application in and to boat or other similar towed trailers, those skilled in the art will recognize the wider applicability of the inventive principles disclosed hereinafter.

One of the problems we have observed with respect to taillights of various boat trailers and other towed trailers for example, and with respect to vehicle lights in general, is the fact that the lights often become damaged. That is, it is not uncommon for a person who does not routinely tow a boat trailer, to experience problems in backing the boat trailer, for example. Often in backing, the taillight of the trailer becomes damaged. Likewise, boat trailers often are backed into water in order to load or unload a boat to be carried or carried by the trailer. Because prior art light assemblies are not waterproof, water entering the light assembly can and often does damage the electrical capabilities of the light. We have developed a relatively low-cost, water proof/resistant and relatively unbreakable back up and/or taillight and/or turning light, for example, that has wide application for vehicles, both driven and towed. In particular, we have found that a lamp assembly can be molded completely from a suitable cellulosic, copolymer, polycarbonate, or acrylic plastic, and inserted in place of conventional taillights on trailers and vehicles, for example. Preferably, we employ light emitting diodes (LEDs) as the source of illumination for the light structure. The LEDs are mounted to a circuit card or board in any predetermined arrangement. The board and associated LEDs then are completely encapsulated or immersed in the material to form a solid, effectively one piece device during the manufacturing process.

While other lamp assemblies have employed LEDs in the past, the products of which we are aware did not provide a light structure that is relatively unbreakable alone or water proof/resistance in combination with the structure's other features. For purposes of this specification, relatively unbreakable means unbreakable in the environment of the lamp assembly's intended use during expected or normal operating conditions. For example, we have found that Tenite® available from Eastman Chemical Company is an acceptable material for the lamp assembly of the present invention where the lamp assembly is intended for use in boat trailers. While the material mix employed for injunction molding may vary for the application illustratively described herein, we believe that the material preferably should have an impact resistance of 4.8 ft-lbs. per inch (ten percent (10%) plasticizer formulation). In boat trailer applications, the material thickness may approach one half inch or more, for example, a thickness for which we were unable to find actual manufacture's data. We have tested other polycarbonate material in prototype assemblies that has sustained 30 ft. lbs. force on the light assembly without damage (tested by dropping a five pound weight from a height of six feet). As indicated above, the preferred material for any particular application is one that does not suffer damage in its intended application during normal or intended operation of that application.

Among the devices of which we are aware that employ LEDs is one described in U.S. Pat. No. 5,632,551 ('551). While employing LEDs generically, the '551 patent describes the use of a conventional lens and an associated metal housing. While recognizing that breakage is a problem, the '551 patent attempts to solve the problem by recessing the lens member within the housing. While the invention described in the '551 may function well in some circumstances, it does not provide the simplified solid structure, water proof/resistance construction and true non-breakable design for light assemblies available with our invention.

BRIEF SUMMARY OF THE INVENTION

One of the objects of this invention is to provide a low-cost lamp assembly;

Another of object of this invention is to provide a lamp assembly that is relatively unbreakable in applicational use.

Another object of this invention is to provide a lamp or light structure employing LEDs for the light source.

Another object of this invention is to provide an LED lamp structure in which the LEDs are arranged in rows and columns, the arrangement of which permits LEDs emitting various visible light colors to be employed in the light structure.

Yet another object of this invention is to provide a lamp structure that is directly replaceable with existing applications for similar lamps assemblies.

Another object of this invention is to provide a lamp structure that exhibits at least water resistance capabilities for preventing damage to electrical components of the structure.

Another object of this invention is to provide a lamp or light structure employing reflectors.

Another object of this invention is to provide a circuit board which allows air to escape during the molding process.

Another object of this invention is to provide a solid structure lamp assembly.

Other objects will be apparent to those skilled in the art in light of the following description and accompanying drawings.

In accordance with this invention, generally stated, an unbreakable lamp finding particular application in automotive vehicle and trailers for example, is provided in which the lamp body defines the lens and the body itself Preferably, the lens and body is constructed from an unbreakable material, unbreakable being defined herein. The lamp includes a circuit board or card having a light unit associated with it. In the preferred embodiment, the light unit is a plurality of LEDs arranged in rows and columns. The lens and body material forms a structure which fully encapsulates in a solid integral part both the light unit and the circuit board. Encapsulation provides at least water resistance properties to the lamp assembly. The lens material is molded in a predetermined manner to provide the body for the lamp assembly.

A method of constructing a lamp assembly in which the lens material defines a lamp body also is disclosed.

BRIEF DESCRIPTION OF THE SEVERAL VIEWS OF THE DRAWINGS

The objects of the invention are achieved as set forth in the illustrative embodiments shown in the drawings, which form a part of the specification. In the drawings.

Corresponding reference characters indicate corresponding parts throughout the several views of the drawings.

DETAILED DESCRIPTION OF INVENTION

The following detailed description illustrates the invention by way of example and not by way of limitation. This description will clearly enable one skilled in the art to make and use the invention, and describes several embodiments, adaptations, variations, alternatives and uses of the invention, including what we presently believe is the best mode for carrying out the invention. It will nevertheless be understood that no limitation in the scope of the invention is thereby intended, and that alterations and further modifications of the illustrative devices are contemplated, including but not limited to such further applications of the principles of the invention illustrated herein as would normally occur to one skilled in the art to which this invention relates.

Figure 1:
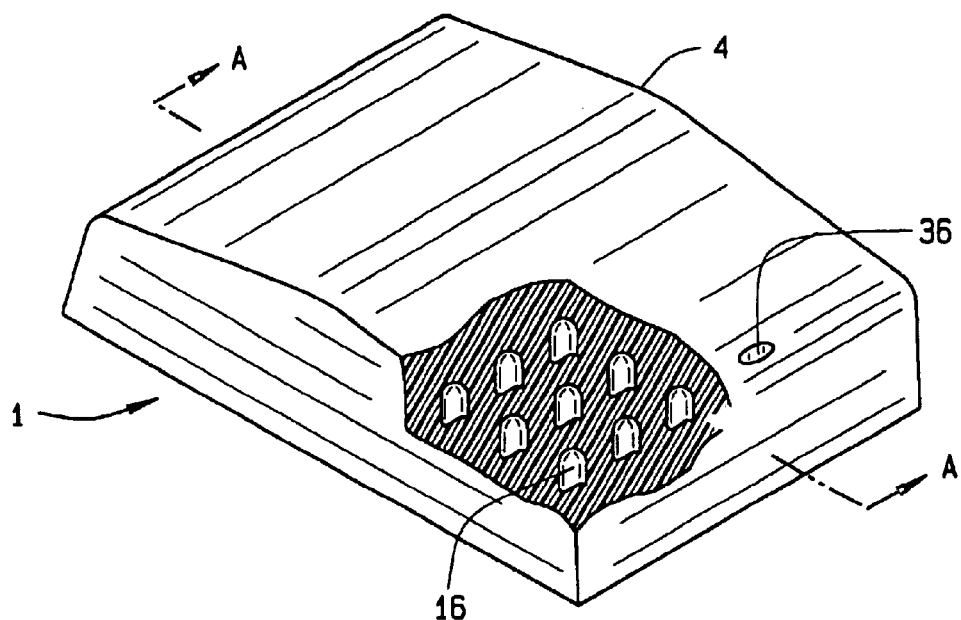
FIG. 1 is view in perspective, partly broken away, of one illustrative embodiment of lamp assembly of the present invention.
Figure 2:
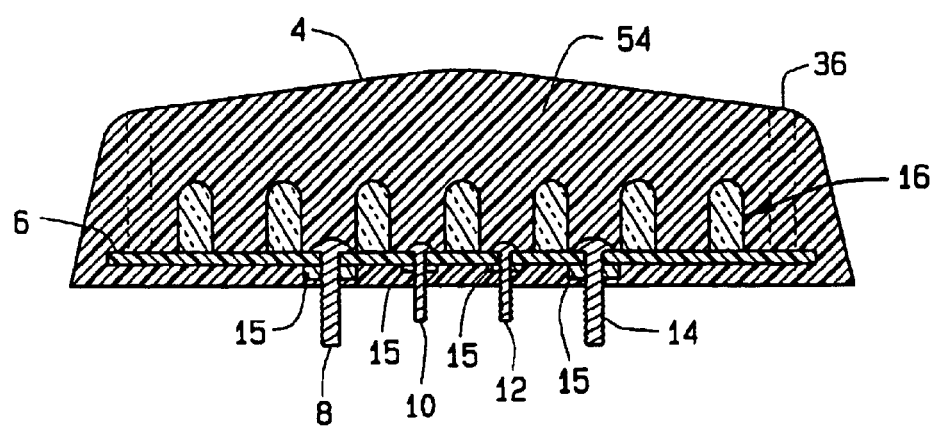
FIG. 2 is a sectional view taken along the line A—A of FIG. 1.

Referring now to FIGS. 1 and 2, reference numeral 1 indicates one illustrative embodiment of lamp assembly of the present invention. The lamp assembly 1 includes a main body 4, which surrounds a circuit board or card 6, electrical connectors 8, 10, 12, 14 each attached to the board 6 with a nut 15, and a plurality of light emitting diodes (LED) 16 which together comprise a light emitting unit 52.

Figure 3:
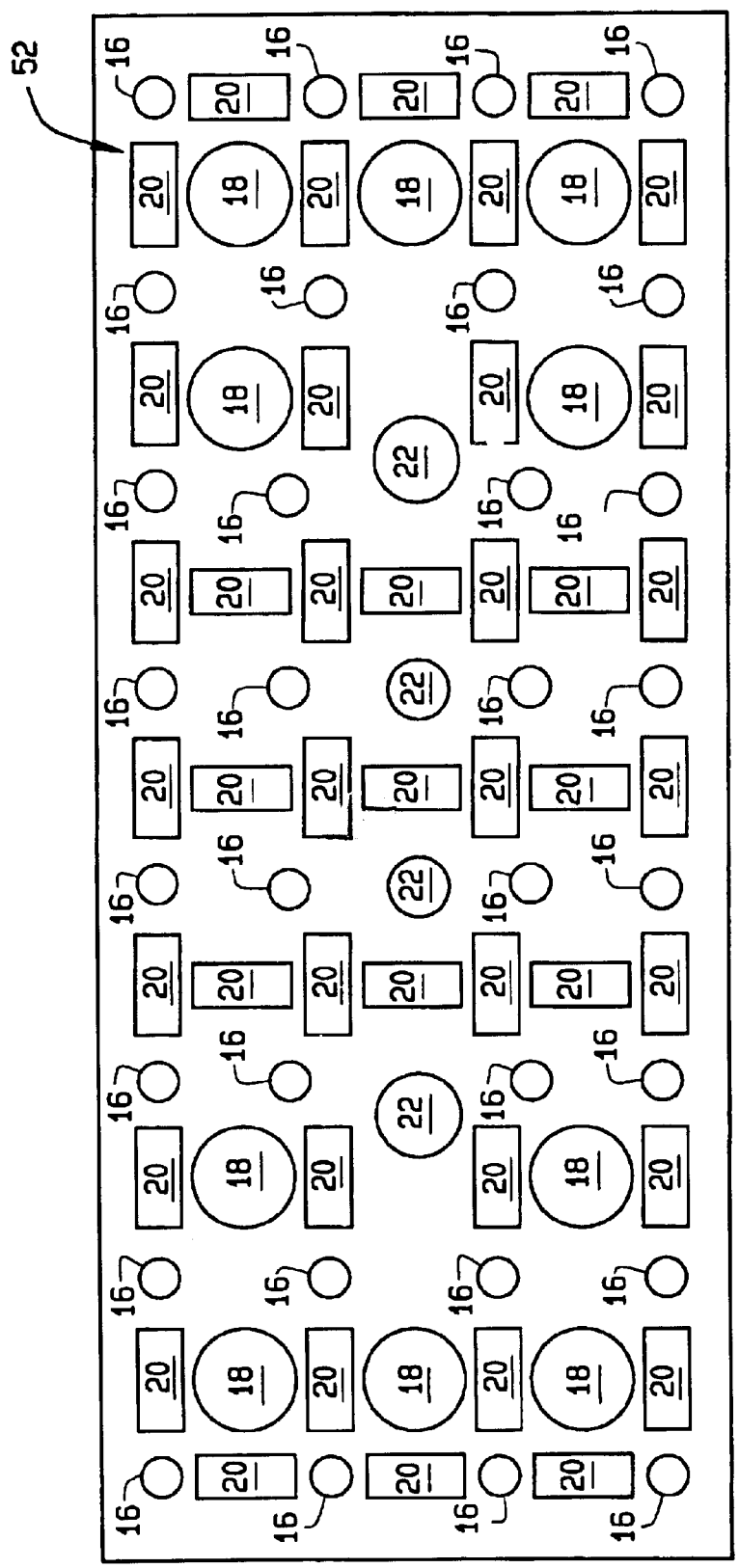
FIG. 3 is a plan view of the circuit board according to an embodiment of the present invention.

Referring to FIG. 3, the circuit board 6 is of conventional construction. However, it preferable that the circuit board 6 defines a plurality of apertures 18. The apertures 18 help prevent gas and/or air, generally in the form of bubbles, from being trapped within the material when the uncured lens material is poured or injected into a mold, as further explained below, thereby the preventing the gas and/or air bubbles from being present within the body 4 when the material cures. Also provided are four electrical connector apertures 22 for attaching the electrical connectors 8, 10, 12 and 14 (8–14) with the nuts 15 to the board 6. However, while the electrical connectors are shown as fasteners attached to the circuit board 6, electrical connectors 8–14 could be wires that extend through the body 4 or a combination of wires and fasteners. Preferably, electrical connector 8 and electrical connector 14 are ground connectors and are larger than connectors 10, 12 so that the entire assembly 1 may be mounted to a structure, such as a vehicle or trailer either as a original equipment assembly or as a replacement assembly for a conventional light. The electrical connector 10 may be a taillight connector, which provides for the LEDs 16 to illuminate at a first, dimmer output level, and electrical connector 12 may be a stop light connector which provides for the LEDs 16 to illuminate at a second, brighter output level. This may be easily accomplished with known methods such as by inserting a resistor in the circuit providing the lower output level. It can be appreciated by one of ordinary skill in the art that only one of electrical connectors 8 and 14 is required to provide an electrical ground and the one of the electrical connectors 10 and 12 may be eliminated to provide for only a single illumination output level. While a male connection is illustrated in FIG. 2, those skilled in the art will appreciate that a female or other interconnection form may be employed, if desired. Finally, the circuit board 6 may also comprise reflectors 20 attached to the board 6 to provide for identification of a parked vehicle or trailer implementing operation of the light assembly 1 of the present invention, for example, when the same is approached by another vehicle at night.

The LEDs 16 preferably are arranged in rows and columns, as best seen in FIGS. 1 and 3. Various arrangements of the LEDs 16 are compatible with the broader aspects of the invention, and depend to some measure on the shape of the body 4 and/or the intended use of the lamp assembly 1. For example, although a generally rectangular body 4 is shown in the drawings, those skilled in the art will appreciate that other shapes, including round, elliptical, triangular, emblematic and the like may be employed in other embodiments of the invention. The configuration of the body 4 will often determine the arrangement required or permitted of the LEDs 16. Those skilled in the art also will recognize that the LEDs 16 need not be arranged in rows and columns or that a single LED 16 may be employed in other applications of the invention.

The design is unique, for example, because the material used for the body 4 defines both a lens 54 and the body for the lamp assembly 1 to provide a solid one piece assembly. Preferably, the body 4 is constructed from relatively unbreakable material. Tenite cellulosic available from Eastman Chemical Company is an acceptable material for the lamp assembly 1 of the present invention where the light assembly 1 is intended for use in boat trailers. As indicated above, that material has an impact strength of 4.8 ft-lbs. per sq. inch. In boat trailer applications, the material thickness may approach one half of inch or more, for example, a thickness for which specific manufacture's data was not available from conventional sources. We have tested other material in prototype assemblies that have sustained 30 ft. lbs. force on the light assembly without damage (tested by dropping a five pound weight from a height of six feet). Again, the preferred material for any particular application is one that does not suffer damage in its intended application during normal or intended operation of that application. In the context of this specification and invention, "unbreakable" has this meaning ascribed to it. The Tenite cullulosic material initially is flowable, and sets up to a final shape over some predetermined period of cure time. The method of cure may vary, depending on the material used to form the body 4. For example, some material may cure in a satisfactory time merely with an ambient air cure. Other materials may require the application of heat or cold to cure satisfactorily. Regardless of cure, however, all embodiments of the invention are designed so that the body 4 encapsulates at least the LEDs 16 and circuit board 6, and arranged and formed to define the lens 54 for the lamp 1. That encapsulation, in turn, provides at least water resistance properties to the lamp assembly 1, since the material is generally impervious to liquid. If care is taken in the manufacturing process with the electrical connection to the circuit board 6, the lamp assembly 1 easily can be made to be water proof in the conventional sense of that term.

Figure 4:
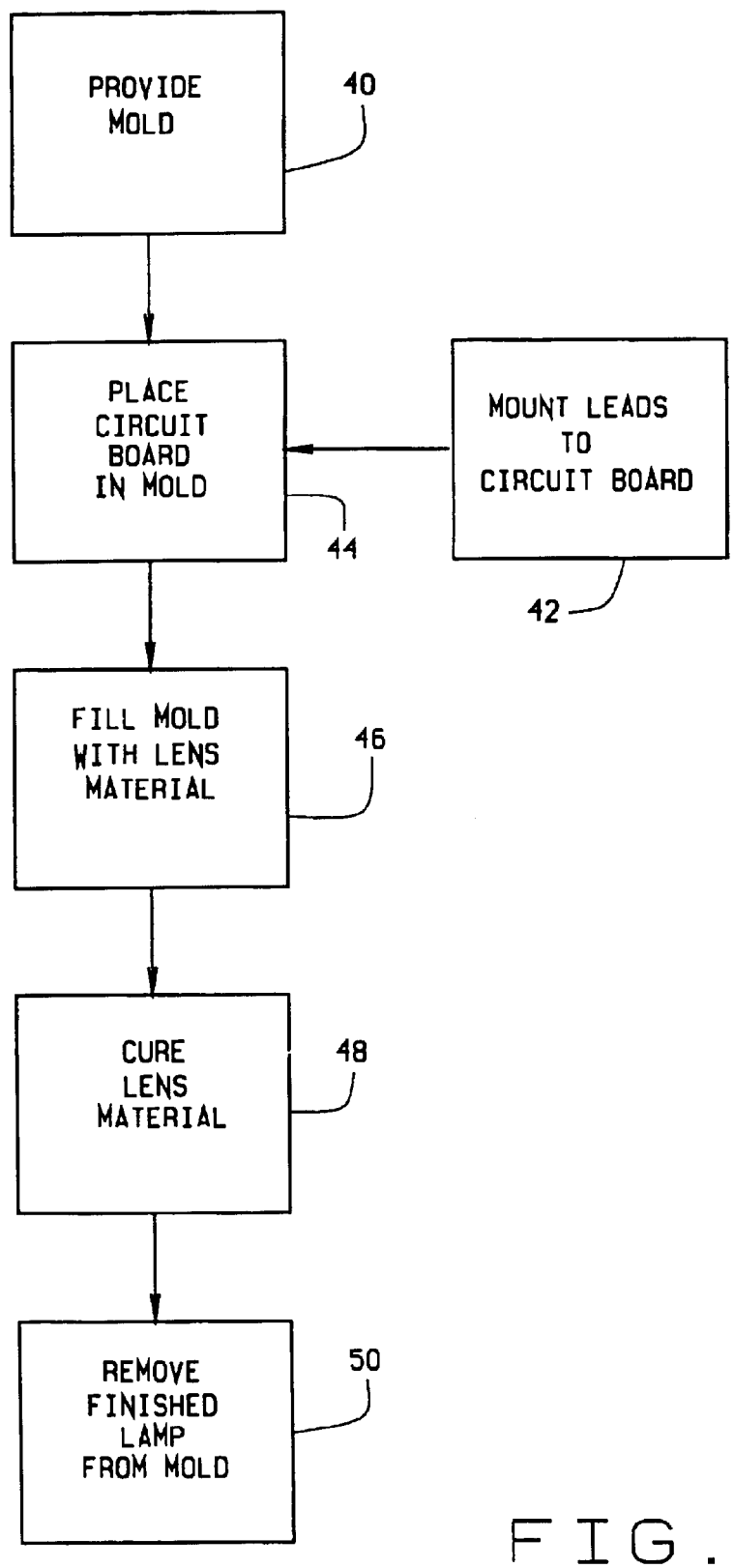
FIG. 4 is a block diagram of one illustrative method shown manufacturing the lamp assembly shown in FIGS. 1 through 3.

A preferred method of manufacture is shown in FIG. 4. A suitable mold 40 is constructed in a conventional method. The mold 40 is designed so that lamp assembly 1 has its intended shape upon removal from the mold. That is to say, the mold 40 is preformed so that the finished lamp assembly 1 may be extracted from the mold directly.

The LEDs are mounted to the circuit board 6 in a step 42. That combined assembly then is placed in the mold 40 in a step 44. As indicated above, preferably the electrical connections 8–14 are attached to the circuit board and inserted in the mold simultaneously with the circuit board and LEDs. However, the electrical connection may be made at a later time, if desired.

In the embodiment illustrated, the mold 40 also has provisions for providing one or more openings 36 through the enclosure. Alternatively, the openings 36 may be formed in the assembly 1 after removal from the mold. Those skilled in the art will recognize that the openings 36 may be eliminated in other embodiments of the invention. In any event, after placement of at least the LEDs and circuit board in the mold 40, the mold is filled with lens material to encapsulate the LEDs and circuit board completely, as illustratively shown in FIG. 2. Thereafter, the lens material is cured in a step 48 and the essentially finished product is removed from the mold in a step 50.

In order to manufacture the lamp assembly 1 in high volumes, we have made prototypes through an injection molding process. In using that process, we found that a high number of rejects were obtained because gas and/or air would become trapped within the lens material during the injection molding process. While the problem was not present with all shoots of material, it was prevalent enough to make the process uneconomical for large scale production. We have found that providing apertures 18 through the circuit board 6 helps prevents gas and/or air from being trapped with the body 4 even when a high speed injection molding process is used to form the lamp assembly 1. The apertures 18 location and number may vary in embodiments of the invention. We have found that the number and location of apertures 18 depend in part on the material used for the body 4, and the speed and consequently pressure at which injection takes place. In addition, the construction of the board and the electrical component attachment thereto should be designed so that they do not hinder the flow of material during the injection molding process.

Because of the ease of manufacture, those skilled in the art will recognize that a number of attributes can be obtained with the lamp assembly 1 of the present invention. Merely by way of example, one or more of the rows 12 of the LEDs 16 may emit a different light spectrum from the remainder of the LEDs 16. Thus, certain of the LEDs 16 may be arranged to provide a yellow arrow indicating a turning motion for the vehicle, while the remaining LEDs 16 emit a light from the red spectrum indicating when the vehicle brakes are applied, for example. Likewise, the material forming the body 4 may have a color pigment associated with it so that the enclosure 1 has a familiar red brake light configuration, if desired.

In view of the above, it will be seen that the several objects of the invention are achieved and other advantageous results are obtained. As various changes could be made in the above constructions without departing from the scope of the invention, it is intended that all matter contained in the above description or shown in the accompanying drawings shall be interpreted as illustrative and not in a limiting sense. Numerous variations, within the scope of the appended claims, will be apparent to those skilled in the art in light of the foregoing description and accompanying drawings. For example, as indicated, the enclosure 1 may assume a variety of shapes. In addition to those described previously, the enclosure 1 may be modified to promote fast curing of the material used for the body 1. Other materials may be employed for the enclosure besides that described. The LED arrangement may vary in other embodiments of this invention. Likewise, the enclosure may be formed in a lens design, if desired. While the light assembly 1 is described as utilizing LEDs, other forms light emitting structures may be employed, if desired. Thus, conventional incandescent lamps or different unconventional sources of light may be employed in embodiments of the invention. LEDs presently are preferred because they offer low energy consumption and long life in applicational use. The light assembly 1 also may be attached to a second structure in a number of ways. Merely by way of example, while conventional threaded fasteners through suitable openings work well, the light assembly 1 may be bracket mounted, surface mounted, or recessed mounted in a friction fit, if desired. Applications of the light assembly 1 are numerous, and the description with respect to boat trailers is not to be construed in a limiting sense.

We claim:

1. A lamp assembly comprising:
   a support circuit board, the circuit board having a first side and a second side, the circuit board defining at least one aperture for communication between the first and second sides of the circuit board;
   a plurality of light emitting diodes mounted to the circuit board;
   an electrical connection attached to the circuit board and extending outwardly of the lamp assembly;
   a mold in place lens formed from material flowable about the circuit board and through the at least one aperture to encapsulate the circuit board and light emitting diodes, to provide a one-piece solid body about said circuit board and light emitting diodes, said solid body being formed into a predetermined shape defining said lamp assembly, the electrical connection extending outwardly of the lens assembly, said body and said lens being formed from the same material.

2. The lamp assembly of claim 1 wherein the circuit board defines a plurality of apertures, the apertures positioned to prevent gasses from being trapped within the material during formation of the mold in place lamp assembly.

3. The lamp assembly of claim 2 wherein the circuit board has a reflector attached thereto.

4. The lamp assembly of claim 3 wherein the circuit board has a plurality of reflector attached thereto.

5. The lamp assembly of claim 1 wherein the LEDs are positioned and arranged in rows and columns.

6. The lamp assembly of claim 5 wherein at lease one of the rows of LEDs emit light having a color different from at least another row of the LEDs.

7. The lamp assembly of claim 6 wherein the lens material has at least one opening formed in it for permitting attachment of the lamp assembly to another structure.

8. The lamp assembly of claim 1 wherein the lamp assembly withstands a force of at least 30 ft.lbs.per square inch of force without damage.

9. A lamp assembly comprising:
   a housing formed from a moldable translucent material;
   a lens defined by the moldable, translucent material forming the lamp assembly;
   a light emitting unit attached to a circuit board wherein the circuit board has been molded within the material, the circuit having at least one aperture formed in it for permitting flow of the translucent material through the circuit board; and
   electrical leads attached to circuit board that extend through the material to allow electrical connection to the circuit board, the housing and lens being formed from the same moldable, translucent material, the material defining a predetermined shape for the lamp assembly.

10. The lamp assembly of claim 9 wherein the circuit board has reflector attached thereto.

11. The lamp assembly of claim 10 wherein the circuit board has a plurality of reflectors attached thereto.

12. The lamp assembly of claim 9 wherein the circuit board defines a plurality of apertures positioned to prevent gasses being trapped with the material.

13. The lamp assembly of claim 9 wherein the light emitting unit comprises a plurality of light emitting unit comprising light emitting diodes (LEDs).

14. The lamp assembly of claim 13 wherein the LEDs are positioned and arranged in rows and columns.

15. The lamp assembly of claim 14 wherein at least a portion of one of the rows of LEDs emits light having a color different from at least a portion of another row of the LEDs.

16. The lamp assembly of claim 9 wherein the lens material has at last one opening formed in it for permitting attachment of the lamp assembly to another structure.

17. The lamp assembly of claim 9 wherein the lens material can withstand a force of at least 30ft.lbs.per square inch without damage.

18. A lamp assembly comprising;

a housing;

a circuit board defining a plurality of apertures;

a light emitting unit connected to the circuit board; and a lens formed from a moldable lens material, said lens material flowable through the aperture plurality;

wherein the circuit board and light emitting unit is submerged within the moldable lens material before hardening and the moldable lens material allowed to harden, such that the circuit board and light emitting unit are encased within the moldable lens material in the substantial absence of air, the housing and lens being formed from the same material, the material defining a predetermined shape for the housing.

19. The lamp assembly of claim 18 wherein the light emitting unit comprise a light emitting diode.

* * * * *